United States Patent [19]

Cruce et al.

[11] 3,976,939
[45] Aug. 24, 1976

[54] CONDUCTOR IDENTIFICATION IN MULTICONDUCTOR CABLES

[75] Inventors: Tommy Clay Cruce; Ernest Joseph Woodall, both of Burlington, N.C.

[73] Assignee: Bell Telephone Laboratories, Incorporated, Murray Hill, N.J.

[22] Filed: June 3, 1975

[21] Appl. No.: 583,162

[52] U.S. Cl. .................. 324/66; 179/175.3 A
[51] Int. Cl.² ................ G01R 31/02; G01R 19/16
[58] Field of Search .......... 324/51, 66; 179/175.25, 179/175.3 R, 175.3 A, 175.3 F

[56] References Cited
UNITED STATES PATENTS

| | | | |
|---|---|---|---|
| 2,869,077 | 1/1959 | Houk | 324/66 |
| 3,252,088 | 5/1966 | Palmer | 324/66 |
| 3,401,238 | 9/1968 | Williams et al. | 179/175.25 |
| 3,430,137 | 2/1969 | Eager et al. | 324/54 |
| 3,644,687 | 2/1972 | Richards | 179/175.3 |
| 3,699,438 | 10/1972 | Webb | 324/51 X |
| 3,902,026 | 8/1975 | Rogers et al. | 324/66 |

*Primary Examiner*—Gerard R. Strecker
*Attorney, Agent, or Firm*—H. L. Logan

[57] ABSTRACT

This specification discloses a system comprising a source for selectively applying a test signal to a selected conductor at a first end of a cable and a detector having a plurality of input terminals for connection, respectively, to at least some of the conductors at the second end of the cable. The detector operates to perform individual comparisons of the amplitudes of the signals on its input terminals with the amplitude of a decreasing reference signal and to produce a signal after a predetermined number of such comparisons in excess of a predetermined value have occurred. This last-mentioned signal causes a display unit to indicate the input terminal on which appeared the signal that produced the last comparison in excess of the predetermined value.

9 Claims, 5 Drawing Figures

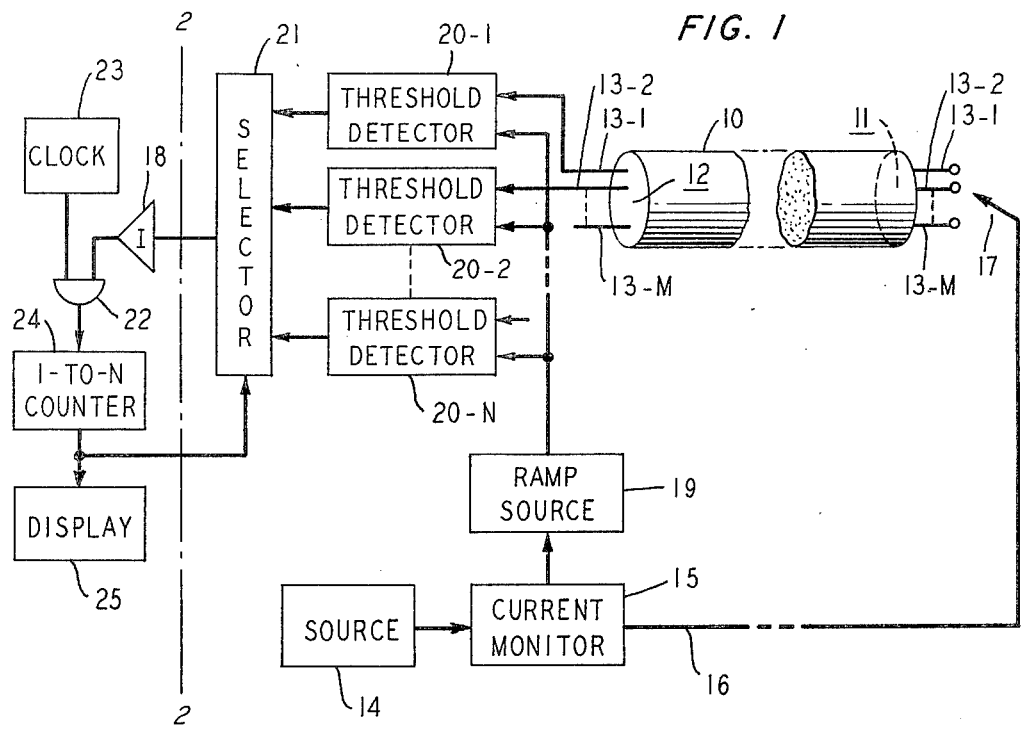

FIG. 3

| TIME | SAMPLER 21 OUTPUT | INVERTER 18 OUTPUT | COUNTER 24 | SELECTOR 21 | COUNTER 26 1-COUNT | COUNTER 28 |
|---|---|---|---|---|---|---|
| BETWEEN $t_1$ AND $t_2$ | 0 | 1 | COUNTING | SELECTING | 0 | NOT COUNTING ZERO OUTPUT |
| BETWEEN $t_2$ AND $t_3$ | 0 | 1 | COUNTING | SELECTING | 0 | NOT COUNTING ZERO OUTPUT |
| AT $t_3$ | 1 | 1 | COUNTING | SELECTING | 1 | STARTS COUNTING |
| BETWEEN $t_3$ AND $t_4$ | 0 | 1 | COUNTING | SELECTING | 1 | COUNTING |
| AT $t_4$ | 1 | 0 | STOPPED | STOPPED | 0 | STOPPED |
| AT $t_5$ | 1 | 1 | STARTS COUNTING | STARTS SELECTING | 1 | STARTS COUNTING |
| BETWEEN $t_5$ AND $t_6$ | 0 | 1 | COUNTING | SELECTING | 1 | COUNTING |
| AT $t_6$ | 1 | 0 | STOPPED | STOPPED | 0 | STOPPED |

CONDUCTOR IDENTIFICATION IN MULTICONDUCTOR CABLES

BACKGROUND OF THE INVENTION

1. Field of the Invention

This invention relates to identifying both ends of a conductor in a multiconductor cable.

2. Description of the Prior Art

A simple and direct method for identifying both ends of a conductor in a multiconductor cable involves applying a signal to the conductor at a first end of the cable and then probing the conductors at the second end until the signal is detected. This method is acceptable in many applications when the signal being sought is easily distinguished from any signal on the remaining conductors as a result of interconductor leakage. When, however, there is relatively high leakage between conductors, the ability to distinguish between directly-conducted and leakage-coupled signals becomes more tedious, more time consuming, and less reliable.

The above problem is very apparent when a section of pulp insulated telephone cable which has become wet due to a loss of sheath integrity is to be replaced. In particular, when replacing such a section it is first necessary to identify both ends of each conductor in the wet section so that correct connections may be made when installing the new section of cable. However, moisture present within the pulp insulation causes interconductor leakage which makes it very difficult to use the above-described method for conductor identification.

SUMMARY OF THE INVENTION

An object of the present invention is to ascertain quickly and accurately both ends of a conductor within a multiconductor cable when relatively high leakage between conductors is present.

This and other objects are achieved by a system comprising a source for selectively applying a test signal to a selected conductor at a first end of a cable and a detector having a plurality of input terminals for connection, respectively, to at least some of the conductors at the second end of the cable. In accordance with the invention, the detector operates to perform individual comparisons of the amplitudes of the signals on its input terminals with the amplitude of a decreasing reference signal and to produce a signal after a predetermined number of such comparisons in excess of a predetermined value have occurred. This last-mentioned signal causes a display unit to indicate the input terminal on which appeared the signal that produced the last comparison in excess of the predetermined value.

When it may be ascertained by other means that the conductor under test is not electrically short-circuited to another conductor, then the predetermined number of comparisons may be made equal to one and the conductor under test is the one connected to the indicated input terminal. This occurs because of two basic facts. First, even under the worst possible leakage conditions, the loss of signal level on the conductor to which the test signal is applied and the gain of signal levels on other conductors is such that the maximum level always appears on the conductor to which the test signal is applied. Secondly, the decreasing reference level of the detector and the repetitive comparison of the input signals with this reference level enables the maximum level input signal to be identified notwithstanding the amount of attenuation produced by the leakage condition.

The embodiment of the invention discussed in the previous paragraph (i.e., with "the particular number " equal to one) functions correctly when the conductor under test is not shorted to another conductor. When, however, the conductor under test is shorted to another conductor, then that embodiment indicates any one of the shorted conductors. A problem therefore exists when other means for detecting shorted conductors is not available.

This last-mentioned problem is overcome in another embodiment of the invention in which shorted conductors are identified in addition to identifying the respective ends of nonshorted but high-leakage conductors. This is achieved by setting the predetermined number of comparisons in excess of the predetermined value equal to two, by selectively permitting additional comparisons to occur until the next one in excess of the predetermined value occurs, and by producing a second indication when the first and last of the comparisons in excess of the predetermined value are not produced by the signal from the same input terminal.

These and other objects and features of the invention will be further appreciated when the following description of embodiments of the invention is considered.

BRIEF DESCRIPTION OF THE DRAWING

In the drawing:

FIG. 1 and 2 illustrate two embodiments of the invention in use for testing multiconductor cables;

FIG. 3 is a chart used in explaining the operation of the embodiment of FIG. 2.

DETAILED DESCRIPTION

Circuit Description of FIG. 1

Figure 4:
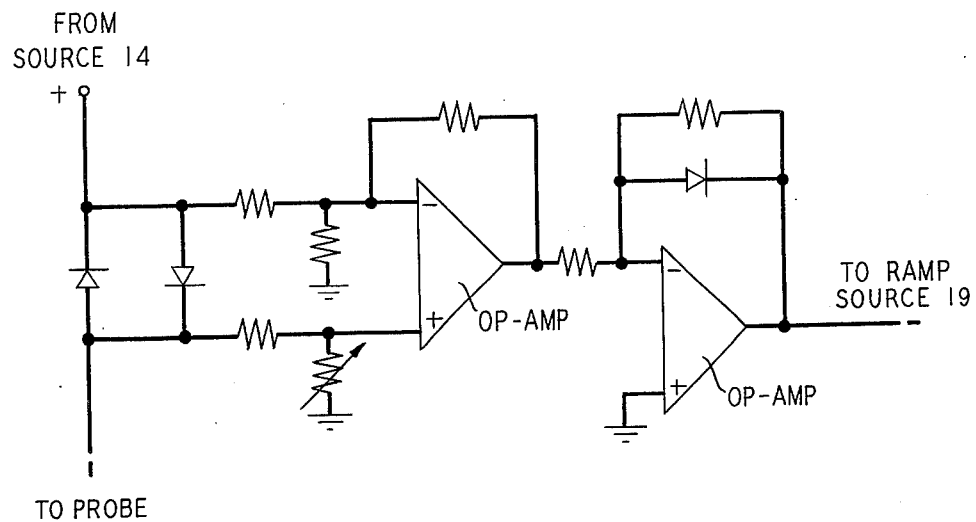
FIG. 4 and 5 disclose a current monitor and a threshold detector, respectively, which may be used in practicing the invention.

FIG. 1 shows a multiconductor cable 10 which is connected to an embodiment of the invention so that corresponding ends of the conductors of cable 10 can be identified. Cable 10 has a far end 11, a near end 12, and a plurality of conductors 13-1 through 13-M. A test signal source 14 is connected by way of a current monitor 15, a lead 16, and a probe 17 to selected conductors 13-1 through 13-M at the far end 11. Lead 16 is a conductor external to cable 10 as, for example, one of the conductors of the replacement cable.

Current monitor 15 responds to current which flows in lead 16 when probe 17 is connected to a conductor. This response causes monitor 15 to produce an output signal. This output signal is applied to a start input of a decreasing ramp reference source 19.

Conductors 13-1 through 13-M at near end 12 are connected to input terminals of a detector comprising a plurality of threshold detectors 20-1 through 20-N, where N is either equal to or greater than M. The output of decreasing-ramp reference source 19 is applied to each of threshold detectors 20-1 through 20-N as a reference, or threshold, signal. The first one of detectors 20-1 through 20-N whose conductor input signal exceeds that of the decreasing-ramp reference signal produces an output signal.

(In the following discussion, the convention of using a binary ONE and a binary ZERO as a form of shorthand to represent the presence and absence, respectively, of logic type signals is employed.)

A selector 21 sequentially and repetitively selects, in a manner to be described, the binary outputs of detectors 20-1 through 20-N. Selector 21 produces a binard ZERO output until a binary ONE from one of threshold detectors 20-1 through 20-N is selected. When such selection occurs, selector 21 produces a binary ONE.

When selector 21 has not selected a ONE, the ZERO output from selector 21 is inverted to a ONE by inverter 18 and applied to an input of an AND gate 22. The output of a clock 23 is also applied to AND gate 22. Gate 22 functions to apply the output of clock 23 to a 1-to-N counter 24. Counter 24 produces an output which repetitively cycles from a value of 1 to N where N corresponds to the number of detectors 20-1 through 20-N. The output of counter 24 is applied to selector 21 so that the output representative of the count of one causes the output of detector 20-1 to be selected, the output representative of the count of two causes the output of detector 20-2 to be selected, and so forth. Each unique output of counter 24 is therefore used to select the output of a unique detector.

The output of counter 24 is also applied to a display 25 to produce a readout indicative of the detector being selected.

Operation Description of FIG. 1

When the embodiment of FIG. 1 is energized but probe 17 is not connected to one of conductors 13-1 through 13-M, counter 24 repetitively runs through its counting function.

When probe 17 is connected to any one of leads 13-1 through 13-M, a current flows from source 14 through current monitor 15, lead 16, at least the selected one of conductors 13-1 through 13-M, at least that conductor's threshold detector, and an unillustrated return path to source 14. This current causes monitor 15 to produce an output which causes ramp reference source 19 to start producing a decreasing-ramp output voltage.

The output from source 19 decreases at a relatively slow rate compared to the rate of the output of clock 23. For example, the decreasing-ramp voltage may require one second to decrease from a maximum value to a minimum value while the output of clock 23 is at a one megahertz rate. The output from each of detectors 20-1 through 20-N is therefore selected repetitively with respect to the decreasing-ramp voltage.

When the ramp voltage decreases to the point that the cable input to one of detectors 20-1 through 20-N exceeds the ramp voltage, then that detector produces a binary ONE. This binary ONE is soon selected by selector 21, which in turn applies a binary ONE to inverter 18. In response, inverter 18 applies a binary ZERO to gate 22. Counter 24 thereupon stops counting, selector 21 stops selecting, and display 25 indicates the count of counter 24. This count identifies the detector which has detected a cable output signal in excess of the decreasing-ramp voltage.

When the conductor to which probe 17 is connected does not have a substantially zero impedance short circuit to another conductor but does have high leakage (because, for example, of moisture), then that conductor is correctly identified at near end 12. There are two reasons for this result. First, even under the worst possible leakage condition, the loss of signal level on the conductor to which the test signal is applied and the gain of signal levels on other conductors are such that the maximum level always appears on the conductor to which the test signal is applied. Secondly, the decreasing reference level of the detector and what in effect comprises a repetitive comparison of the input signal with this reference level enables the maximum level input signal to be identified notwithstanding the amount of attenuation produced by the leakage condition.

There is the possibility of substantially zero impedance short circuits between the conductors of cable 10. When this happens, two or more detectors produce binary ONE outputs and selector 21 stops on the first ONE selected. A separate piece of test equipment could, of course, be utilized first to identify any conductors shorted together. However, in further accordance with the present invention, shorted conductors may be identified in addition to identifying the respective ends of nonshorted but high-leakage conductors. This is accomplished by an embodiment comprising the embodiment of FIG. 1 with additional circuitry added as shown in FIG. 2.

Circuit Description of FIG. 2

The embodiment of FIG. 1 may be adapted, in accordance with the invention, to also detect and identify short circuits between cable conductors by adding elements to the circuitry to the left of line 2—2 of FIG. 1. This circuitry, along with these additional elements, is shown in FIG. 2.

FIG. 2 shows a 0-to-2 counter 26 connected between selector 21 and inverter 18 so that two binary ONEs must be produced by selector 21 before a binary ONE is applied to inverter 18. An AND gate 27 receives the one-count output of counter 26 and the output of clock 23. When the one-count output of counter 26 is a binary ONE, the output of clock 23 is applied, via gate 27, to a 0-to-N counter 28. Counters 26 and 28 receive, as reset to zero inputs, the same output of monitor 15 which is applied to ramp source 19.

A less-than-N alarm 29 is connected to counter 28. When enabled by a binary ONE on the two-count output terminal of counter 26, alarm 29 is activated unless the count in counter 28 is equal to N.

Finally, FIG. 2 includes a single-pulse rescan source 30 which, when operated, applies a pulse to a reset-to-one input of counter 26.

Operation of FIG. 2

FIG. 3 is a chart used in the following discussion of the operation of FIG. 2.

a. At time $t_1$, the embodiment is energized but probe 17 is not connected to any conductor.

b. Between times $t_1$ and $t_2$, the embodiment is still energized and the probe is still unconnected. During this interval, selector 21 produces a binary ZERO output, inverter 18 produces a binary ONE output, counter 24 is counting, counter 28 produces a zero output, and selector 21 is selecting. This is shown on the first line of the chart of FIG. 3.

c. At time $t_2$, probe 17 is connected to the conductor.

d. Between times $t_2$ and $t_3$, the circuit of FIG. 2 is operating as in the interval between times $t_1$ and $t_2$.

e. At time $t_3$, selector 21 selects a detector producing a binary ONE and, in turn, produces a binary ONE output. This is recognized by counter 26 which applies a binary ONE to gate 27, thus causing counter 28 to start counting. Counter 24 continues to count and selector 21 continues to select because the two-count output of counter 26 is still a ZERO.

f. Between times $t_3$ and $t_4$, selector 21 is producing a ZERO output. Counters 24 and 28 continue to count.

g. At time $t_4$, a second binary ONE output is produced by selector 21. This is recognized by counter 26 which then produces a binary ZERO as its one-count output and a binary ONE as its two-count output. In response to this action, counters 24 and 28 stop counting, less-than-N alarm 29 is enabled, and ramp reference source 19 receives an input which causes its output to remain at its present level until source 19 is recycled by the output from monitor 15.

When probe 17 is connected to a conductor which is not short-circuited to a second conductor, selector 21 selects all N of detectors 20-1 through 20-N between times $t_3$ and $t_4$. After this interval, therefore, counter 28 has an output of N when less-than-N alarm 29 is enables. Alarm 29 therefore does not sound and the operator is assured that the conductor to which probe 17 is connected is not short-circuited to any other conductor. At this time, the conductor end to which probe 17 is connected and the conductor end connected to the detector identified by display 25 are tagged and probe 17 is connected to another conductor so that the respective ends of that conductor can be identified.

When, on the other hand, probe 17 is connected to a conductor which is short-circuited to at least one other conductor, selector 21 produces a second binary ONE when it has only partially selected detectors 20-1 through 20-N. This second binary ONE (at time $t_4$) stops counter 28 at a less-than-N count. Alarm 29, which is enabled by counter 26 at time $t_4$, produces an output in response to this less-than-N count and the operator knows at least one conductor is short-circuited to the one to which probe 17 is attached. At this time, the conductor end to which probe 17 is connected and the conductor end connected to the detector identified by display 25 are appropriately tagged (for example, "shorted conductors"). To identify the other ends of the shorted conductors, rescan source 30 is activated.

h. At time $t_5$, the single pulse produced by source 30 resets counter 26 to produce a binary ONE as its one-count output and a binary ZERO as its two-count output. This causes counters 24 and 28 to start counting and selector 21 to start selecting.

i. Between times $t_5$ and $t_6$, selector 21 pproduces a ZERO output, counters 24 and 28 continue to count, and selector 21 continues to select.

j. At time $t_6$, selector 21 produces a third binary ONE output and counter 26 produces a binary ZERO as its one-count output and a binary ONE as its two-count output. As a result of this action, counters 24 and 28 and selector 21 stop. At this time the conductor end connected to the detector identified by display 25 is appropriately tagged.

When only two conductors are shorted together, counter 28 at time $t_6$ has an N count output and alarm 29 is not activated. The operator then knows that only two conductors are shorted together and may then proceed to identify the ends of another conductor by connecting probe 17 to that conductor and rerunning the test procedure. However, when more than two conductors are shorted together, counter 28 at time $t_6$ produces a less-than-N output and alarm 29 is again activated. The operator, after appropriately tagging the conductor end, again activates source 30. This procedure is continued until alarm 29 is no longer activated by the output of counter 28. Then probe 17 is connected to another conductor.

In summary, zero-to-two counter 26 initially functions to start counting in zero-to-N counter 28 upon the first ONE from selector 21 and to stop counting in 1-to-N counter 24 and zero-to-N counter 28 upon the second ONE from selector 21. When counter 28 registers a count of N, no shorted conductors are present and the count displayed on display 25 identifies the conductor end of the conductor to which probe 17 is connected; when counter 28 registers a count of less-than-N, shorted conductors are known to be present and the count displayed on display 25 identifies the near end of one of the shorted conductors. Rescan source 30 is activated by the operator each time shorted conductors are indicated by a less-than-N count in counter 28. Each time single-pulse rescan source 30 is activated, it cooperates with counter 26 to permit counters 24 and 28 to count and selector 21 to select until the next ONE output from selector 21 occurs. The count displayed on display 25 each time counter 24 stops is used to identify another conductor end which belongs to the shorted conductors. These same counts are displayed on display 25 when probe 17 is connected to another of the conductors in the short-circuited group.

Thus, in addition to its use for identifying both ends of each nonshorted conductor, this embodiment of the invention may be used to identify all ends of conductors which are short-circuited to one another.

EXAMPLES OF ELEMENTS WHICH MAY BE USED IN THE DISCLOSED EMBODIMENTS

1. Source 14 — This source may be either of a DC or AC type and may comprise a battery or oscillator. When an oscillator is used, the detector discussed below would be modified to accommodate the AC nature of the output, as, for example, by adding a sample and hold circuit.

2. Current Monitor 15 — A pair of operational amplifiers connected as shown in FIG. 4 may be used. The first amplifier functions as a difference amplifier while the second amplifier produces either a relatively high positive voltage output or a substantially zero voltage output in response to negative and positive outputs, respectively, from the first amplifier.

3. Inverter 18 — This may comprise a conventional inverter circuit.

4. Ramp Source 19 — This source may comprise a capacitor which is charged from a DC source and discharged through a resistor and a gate which is enabled by the output of monitor 15 and disabled by the one-output of counter 26.

Figure 5:
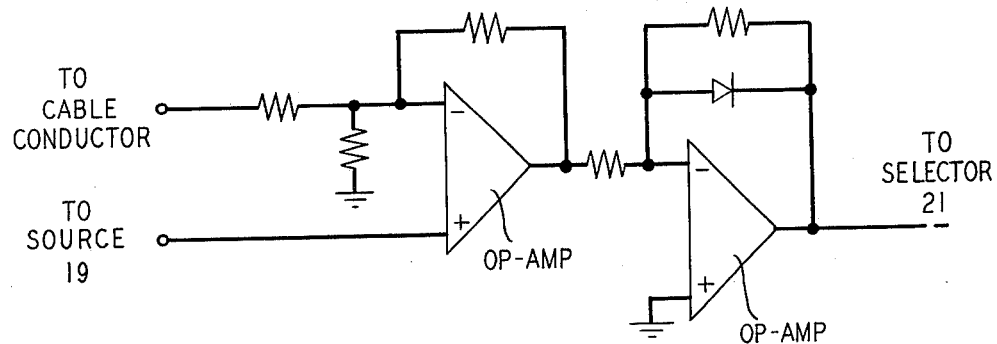

5. Threshold Detectors 20 — These detectors may each take the form of the detector shown in FIG. 5. The detector shown in FIG. 5 comprises a pair of operational amplifiers which function in the same manner as discussed above with respect to FIG. 4.

6. Selector 21 — This may comprise N groups of switches where each group is enabled by a unique output from counter 24 so as to "pass" the output of a unique one of detectors 20-1 through 20-N to the output termnal of selector 21. RCA 4067 multiplexers are useful for this purpose.

7. AND Gates 22 and 27, Clock 23, and Counters 24, 26, and 28 — These are all conventional circuits which require no further comments.

8. Display 25 — This may comprise LED decimal readouts preceded by a conventional binary-to-decimal decoder.

9. Less-Than-N Alarm 29 — This may comprise any sort of alerting device (auditory or visual) which is preceded by an AND gate combination which recognizes the count-of-two output of counter 26 as an enabling signal and a count of N output from counter 28 as a disabling signal.

10. Single-Pulse Rescan Source 30 — This may comprise a conventional single-shot multivibrator.

What is claimed is:

1. In a system comprising a source to selectively apply a test signal to a conductor at one end of a multiconductor cable and a detector to identify that conductor at the other end of the cable by detecting the presence of said signal, an improvement characterized in that said detector comprises, first means for performing individual comparisons of the amplitudes of a plurality of input signals with the amplitude of a decreasing reference signal and for producing an output signal after a predetermined number of said comparisons exceed a predetermined value, said reference signal produced by said first means and decreasing in amplitude as a function of time until the occurrence of at least the first comparison of said predetermined number of comparisons, and said first means has input terminals for connection to the conductors of said cable for receiving said input signals, and second means responsive to said output signal for indicating the input terminal on which appeared the input signal producing the last of said comparisons in excess of said predetermined value.

2. A system in accordance with claim 1 in which, said first means comprises a source responsive to the application of said test signal to said conductor to produce a decreasing reference signal, a plurality of threshold detectors for receiving said input signals and said reference signal and each adapted to produce an output of a first type in response to a comparison between its input signal and said reference signal exceeding said predetermined value, and a selector for sequentially and repetitively making available outputs produced by said threshold detectors, and said second means comprises a counter for receiving clock pulses and repetitively counting from one to N, where N equals the number of said threshold detectors and, furthermore, for applying its output to said selector to cause said selector to make available said detector outputs, means for indicating the output of said counter, and means responsive to said detector first type outputs made available by said selector to make said counter nonresponsive to said clock pulses.

3. A system in accordance with claim 2 in which said predetermined number equals two and said system further comprises, third means for rendering said counter again responsive to said clock pulses, and a second counter which counts from zero to N for counting both the clock pulses occurring during said predetermined number of comparisons and the clock pulses occurring between said third means rendering said counter again responsive and the next one of said comparisons exceeding said predetermined value.

4. In a system comprising a source to selectively apply a test signal to a conductor at one end of a multiconductor cable and a detector to identify that conductor at the other end of the cable by detecting the presence of said signal, an improvement characterized in that said detector comprises, first means for performing individual comparisons of the amplitudes of a plurality of signals with the amplitude of a decreasing reference signal produced by said first means, said first means having input terminals for connection, respectively, to at least some of the conductors of said cable for receiving said signals, and second means responsive to said first means to indicate the input terminal on which appears the signal resulting in the last of a predetermined number of said comparisons which exceed a predetermined value.

5. A system in accordance with claim 4 in which said first means comprises, a source responsive to the application of said test signal to said conductor to produce a decreasing reference signal, N threshold detectors for receiving said signals on said input terminals and said decreasing reference signal and each adapted to produce an output of a first type in response to a comparison between its signal from said input terminals and said reference signal exceeding said predetermined value, and a selector for sequentially and repetitively making available the outputs of said threshold detectors.

6. A system in accordance with claim 5 in which said second means comprises, a counter for receiving clock pulses and repetitively counting from one to N, where N equals the number of said threshold detectors and, furthermore, for applying its output to said selector to cause said selector to make available said detector outputs on a sequential and repetitive basis, means for indicating the output of said counter, and means responsive to said detector first type outputs made available by said selector to make said counter nonresponsive to said clock pulses.

7. A system in accordance with claim 6 in which said predetermined number equals two and said system further comprises, third means for rendering said counter again responsive to said clock pulses, and second counting means which counts from zero to N for counting both said clock pulses occurring during said predetermined number of comparisons and said clock pulses occurring between said third means rendering said counter again responsive and the next one of said comparisons exceeding said predetermined value.

8. A system for identifying both ends of at least one conductor of a multiconductor cable, said system comprising, a source for selectively applying a potential to said conductors at one end of said cable, a source for producing a reference signal whose level decreases as a function of time, a plurality of N threshold detectors all connected to said reference signal source so that the threshold levels of said detectors are set in response to said reference signal, all of said detectors having input terminals for connection, respectively, to at least some of said conductors at the other end of said cable, and each detector producing an output signal in response to a signal on the conductor to which it is connected exceeding said detector's threshold level, a counter adapted to respond to clock pulses and repetitively count from one to N, selecting means connected to said detectors and responsive to said counter to sequentially and repetitively make available output signals produced by said threshold detectors, and means responsive to said first type outputs made available to make said counter nonresponsive to said clock pulses when a predetermined number of said selecting means output signals occur.

9. A system in accordance with claim 8 in which, said last-mentioned means comprises a second counter which counts from zero to two, is resettable to either its zero or one states, and has count-of-one and count-of-two outputs, said second counter having its input connected to receive said first type outputs made available by said selecting means and its count-of-two output used to render the first-mentioned counter nonresponsive to said clock pulses, means for resetting said second counter to its one state, and a third counter which counts from zero to N, said third counter adapted to count said clock pulses in response to said count-of-one output from said second counter.

* * * * *